United States Patent [19]

Johnson

[11] 4,087,294
[45] May 2, 1978

[54] LITHIUM DOPED MERCURY CADMIUM TELLURIDE

[75] Inventor: Eric S. Johnson, Minnetonka, Minn.

[73] Assignee: Honeywell Inc., Minneapolis, Minn.

[21] Appl. No.: 757,267

[22] Filed: Jan. 6, 1977

[51] Int. Cl.² ............................................. H01L 31/00
[52] U.S. Cl. .................................. 148/33; 75/134 H; 148/1.5; 148/187; 148/178; 252/62.3 ZT
[58] Field of Search ...................... 75/135, 169, 134 H; 357/11; 252/62.3 ZT; 148/188, 189, 187, 186, 33, 1.5, 178

[56] References Cited

U.S. PATENT DOCUMENTS

| | | | |
|---|---|---|---|
| 3,483,028 | 12/1969 | Bell et al. | 252/62.3 ZT X |
| 3,496,024 | 2/1970 | Ruehrwein | 148/33.5 X |
| 3,826,721 | 7/1974 | Hall | 148/33 X |
| 3,949,223 | 4/1976 | Schmit et al. | 357/32 X |
| 3,959,026 | 5/1976 | Marine et al. | 148/1.5 |

*Primary Examiner*—G. Ozaki
*Attorney, Agent, or Firm*—John S. Munday

[57] ABSTRACT

Mercury cadmium telluride carrier concentration can be adjusted by having a quantity of lithium dispersed therein in an amount sufficient to measurably increase the acceptor concentration of the semiconductor. Methods of forming the acceptor doped mercury cadmium telluride include diffusion of a quantity of lithium into an already existing body of mercury cadmium telluride. Formation of NP junctions and P−P+ regions are disclosed using the compositions and methods of the present invention.

9 Claims, 7 Drawing Figures

HALL COEFFICIENT AND RESISTIVITY VERSUS INVERSE TEMPERATURE FOR COMPENSATED Li-DIFFUSED AND FOR HEAT-TREATED (NO Li), n-TYPE $Hg_{0.6}Cd_{0.4}Te$.

LITHIUM DOPED MERCURY CADMIUM TELLURIDE

ORIGIN OF THE INVENTION

This invention was made in the course of a contract with the Department of the Air Force.

BACKGROUND OF THE INVENTION

The present invention is concerned with mercury cadmium telluride semiconductor devices. In particular, the present invention is directed to a method of introducing impurities into mercury cadmium telluride. For the purposes of this specification, the common chemical equations for mercury cadmium telluride (Hg,Cd)Te or $Hg_{1-x}Cd_xTe$, will be used.

Mercury cadmium telluride is an intrinsic photodetector material which consists of a mixture of cadmium telluride, a wide gap semiconductor ($E_g=1.6eV$), with mercury telluride, which is a semimetal having a negative energy gap of about $-0.3eV$. The energy gap of the alloy varies approximately linearly with $x$, the mole fraction of cadmium telluride in the alloy. By properly selecting $x$, it is possible to obtain (Hg,Cd)Te detector material having a peak response over a wide range of infrared wavelengths. High performance (Hg,Cd)Te detectors have been achieved for wavelengths of from about one to about 30 microns.

Mercury cadmium telluride photodiodes have found increasing use in recent years. With this increasing use, more sophisticated photodiodes such as (Hg,Cd)Te reach-through avalanche photodiodes have become desirable. As a result, improved methods of forming PN junctions in (Hg,Cd)Te have become highly desirable. Also, other uses of either P-type or N-type material doped to various degrees have found uses not previously considered.

In another area of technical development, (Hg,Cd)Te is of particular importance as a detector material for the important 8 to 14 micron atmospheric transmission "window". Extrinsic photoconductor detectors, noteably mercury doped germanium, have been available with high performances in the 8 to 14 micron wavelength interval. These extrinsic photoconductors, however, require very low operating temperatures of below 30° K. (Hg,Cd)Te intrinsic photodetectors, having a spectral cutoff of 14 microns, on the other hand, are capable of high performance at 77° K.

The possible application of (Hg,Cd)Te as an intrinsic photodetector material for infrared wavelengths was first suggested by W. G. Lawson, et al., *J. Phys. Chem. Solids*, 9, 325 (1959). Since that time extensive investigation of (Hg,Cd)Te detectors has been achieved for wavelengths from about one to 30 microns.

Despite the potential advantages of (Hg,Cd)Te as an infrared detector material, (Hg,Cd)Te photodetectors have recently found wide use in infrared detector systems. A difficulty with (Hg,Cd)Te has been in preparing high quality, uniform material in a consistent manner. The preparation of (Hg,Cd)Te crystals having the desired conductivity type, has been found to be particularly difficult.

Several properties of the (Hg,Cd)Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Crystal growth methods, which involve slow cooling along the length of an ingot, produce an inhomogeneous body of (Hg,Cd)Te. Second, the high vapor pressure of Hg over the melt requires special care to maintain melt stoichiometry. Third, the segregation of excess Te can give rise to a pronounced constitutional super cooling.

A number of bulk growth techniques have been investigated. Zone melting methods for preparing (Hg,Cd)Te have been developed by B. E. Bartlett, et al., *J. Mater. Sci.*, 4, 266 (1969); E. Z. Dzuiba, *J. of Electrochem. Soc.*, 116, 104 (1969); and R. Ueda, et al., *J. Crystal Growth*, 13/14, 668 (1972). Still other bulk growth techniques for (Hg,Cd)Te have been described by J. Blair, et al., *Conference on Metallurgy of Elemental and Compound Semiconductors*, 12, 393 (1961) and J. C. Woolley, et al., *J. Phys. Chem. Solids*, 13, 151 (1960).

All of the bulk growth techniques require additional post-growth processing steps to produce photodetectors. The crystal must be sliced and the surface prepared by polishing and etching. The (Hg,Cd)Te slice is then epoxied to a substrate such as germanium. This is a particular disadvantage in the fabrication of detector arrays, since it is inconvenient, expensive and generally unsatisfactory to fabricate arrays by assembling discrete detector elements. The epoxy layer, in addition to complicating detector and detector array fabrication, results in a thermal barrier between the (Hg,Cd)Te and the substrate. This thermal barrier can adversely affect performance when significant heating occurs during use.

Epitaxial growth techniques defined below offer the possibility of eliminating the epoxy layer and avoiding many of the post-growth processing steps required for bulk growth techniques. An epitaxial layer is a smooth continuous film grown on a substrate, such that the film crystal structure corresponds to and is determined by that of the substrate. The desired epitaxial layer is single crystal with uniform thickness and electrical properties. The substrate has a different composition or electrical properties from that of the epitaxial layer.

Vapor phase epitaxial growth techniques have been investigated in an attempt to grow (Hg,Cd)Te layers. One vapor phase epitaxial growth technique which has been investigated is the vapor transport of the three constituent elements to a substrate with compound and alloy formation at that point. The vapor transport generally involves additional materials as transport agents, such as halogens. The vapor transport techniques have been described by R. Ruehrwein (U.S. Pat. No. 3,496,024), G. Manley, et al., (U.S. Pat. No. 3,619,282), D. Carpenter, et al., (U.S. Pat. No. 3,619,283) and R. Lee, et al., (U.S. Pat. No. 3,642,529).

Another vapor phase epitaxial growth process has been studied by R. J. Hager, et al., (U.S. Pat. No. 3,725,135) and by G. Coehn-Solal, et al., *Compt. Rend.*, 261, 931 (1965). This approach involves an evaporation--diffusion mechanism without the use of any additional materials as transport agents. In this method, a single crystal wafer of CdTe is used as the substrate, and either HgTe or (Hg,Cd)Te is used as the source. At a high enough temperature the material evaporates from the source and migrates in the vapor phase to the CdTe substrate, on which it deposits epitaxially.

In spite of their apparent advantage, epitaxial films of (Hg,Cd)Te formed by vapor phase techniques have been less satisfactory than (Hg,Cd)Te crystals formed by bulk growth because of a compositional gradient along the crystal growth direction which has made them less desirable for detector applications.

Other epitaxial growth techniques have also been attempted. R. Ludeke, et al., *J. Appl. Phys.*, 37, 3499 (1966) grew epitaxial films of (Hg,Cd)Te on single crystal barium fluoride substrates by flash evaporation in vacuum. The samples were grown for studies of optical properties. The technique is probably not practical for the preparation of detector material. H. Krause, et al., *J. Electrochem. Soc.*, 114, 616 (1967), deposited films of (Hg,Cd)Te on single crystal substrates of sodium chloride, germanium and sapphire by means of cathodic sputtering. The resulting films were amorphous as deposited and became crystalline only upon subsequent annealing. The formation of (Hg,Cd)Te by mercury ion bombardment of CdTe has been attempted by N. Foss, *J. Appl. Phys.*, 39, 6029 (1968). This approach was not successful in forming an epitaxial layer.

Another epitaxial growth technique, liquid phase epitaxy, has been used with success in growing other semiconductor materials and in growing garnets for bubble memory applications. In particular, liquid phase epitaxy has been used successfully in the preparation of gallium arsenide, gallium phosphide and lead tin telluride. These materials generally differ from (Hg,Cd)Te, however, in that they (GaAs and GaP) do not have all the severe segregation problem present in (Hg,Cd)Te nor do they have the problem of high vapor pressure of mercury over the melt.

U.S. Pat. No. 3,718,511 by M. Moulin, which describes liquid phase epitaxial growth of lead tin telluride and lead tin selenide, suggests that analogous growth arrangements could be made for the alloys zinc selenide telluride and (Hg,Cd)Te. The patent, however, gives specific examples of liquid phase epitaxy only for lead tin telluride and lead tin selenide. Despite the suggestion by Moulin, prior attempts to grow (Hg,Cd)Te by liquid phase epitaxy have proved unsuccessful. Thermodynamic considerations or experimental difficulties have prevented achievement of detector-grade (Hg,Cd)Te material.

However, high quality detector-grade (Hg,Cd)Te epitaxial layers have been formed by the liquid phase epitaxial growth techniques of U.S. Pat. No. 3,902,924. A liquid solution of mercury, cadmium and tellurium is formed and is contacted with a substrate. The liquid solution in the boundary layer next to the substrate has a liquidus composition which is corresponding to the solidus composition of the desired (Hg,Cd)Te layer at the growth temperature by the appropriate tie line. Supersaturation produces growth of a layer of (Hg,Cd)Te on the substrate.

The electrical properties of mercury cadmium telluride can be altered either by changing the stoichiometry or by foreign impurity doping. It is generally theorized that interstitial mercury and cadmium produce N-type conductivity while mercury and cadmium vacancies as well as tellurium interstitials produce P-type conductivity. In Applied Physics Letters 10, 241 (1967) C. Verie and J. Ayas suggested the formation of PN junctions in mercury cadmium telluride by the adjustment of stoichiometry. The formation of PN junctions by diffusion of foreign impurities into mercury cadmium telluride is complicated by two requirements. First, it has been thought that the impurity must be able to be diffused into mercury cadmium telluride at a reasonably low temperature. This is necessary to prevent excessive dissociation of the mercury telluride, which would drastically change stoichiometry. The relatively small dissociation energy of mercury telluride greatly complicates the diffusion and annealing procedures for junction preparation. Second, the impurity atom must not completely replace mercury in the lattice and form yet another compound rather than simply dope the crystal. This problem is also due to the small dissociation energy of mercury telluride. Examples of compounds formed by impurities include $In_2Te_3$, $TeI_2$ and $TeI_4$. None of these materials affect the donor or acceptor concentration in the manner desired.

In U.S. Pat. No. 3,743,553, PN junctions are formed in an N-type body of mercury cadmium telluride by depositing a layer of gold on a surface of the N-type body and heating the body to diffuse the gold into the body, thereby forming a region of P-type conductivity in the N-type body.

The formation of PN junctions in (Hg,Cd)Te is complicated by the small dissociation energy of mercury telluride in the alloy. So too are the difficulties incurred in adjusting carrier concentrations of adjoining regions of the same type. The formation of PN junctions must not cause excessive dissociation of the mercury telluride, since this will adversely affect the electrical and optical properties of the resulting devices.

Several techniques have been developed for forming N-type layers on a P-type body of (Hg,Cd)Te. Among these techniques are bombardment with protons, electrons or mercury ions. These techniques create an N-type layer by creating a damage induced donor state. These techniques are described in Foyt, et al., "Type Conversion and N-P Junction Formation in (Hg,Cd)Te Produced by Proton Bombardment", Appl. Phys. Let., 18, 321 (1971); McIngailis, et al., "Electron Radiation Damage and Annealing of (Hg,Cd)Te at Low Temperatures," J. Appl. Phys., 44, 2647 (1973); and Fiorito, et al., "Hg-Implanted (Hg,Cd)Te Infrared Low Photovoltaic Detectors in the 8 to 14 Micron Range", Appl. Phys. Let., 23, 448 (1973).

Another technique of forming N-type on P-type (Hg,Cd)Te is described by Marine, et al., "Infrared Photovoltaic Detectors from Ion-Implanted (Hg,Cd)Te", Appl. Phys. Let., 23, 450 (1973). This method involves aluminum ion implantation and subsequent anneal at 300° for 1 hour to form an N-type in a P-type (Hg,Cd)Te body.

Formation of P-type layers on N-type (Hg,Cd)Te, is limited to two techniques. One common method of forming P-type regions in N-type (Hg,Cd)Te is by depositing a gold layer on a surface of the N-type body and then heating the body to diffuse the gold, thereby forming a region of P-type conductivity. This method is described in U.S. Pat. No. 3,743,553, by M. W. Scott, et al. While this method is generally satisfactory, it does have some shortcomings. In particular, it is difficult to form very abrupt, well-defined PN junctions because gold diffuses extremely rapidly in (Hg,Cd)Te. Devices such as reach-through avalanche photodiodes and wide bandwidth photodiodes, therefore, are difficult, if not impossible to fabricate using gold diffusion.

Another method has been proposed in a commonly owned copending application, filed Mar. 1, 1976, having Ser. No. 662,293 now U.S. Pat. No. 4,003,759. That application discloses a method of introducing acceptor impurities into a region of an (Hg,Cd)Te body. This method allows fabrication of an abrupt, well-defined PN junctions in (Hg,Cd)Te, and comprises implanting gold ions into the (Hg,Cd)Te body and heat treating the body at a relatively low temperature for a short duration.

SUMMARY OF THE INVENTION

It has now been discovered that acceptor doped mercury cadmium telluride can be prepared according to the practices of the present invention by a significant departure from the teachings of the prior art. Specifically, it has been discovered that lithium may be dispersed in a quantity of mercury cadmium telluride to measurably increase the acceptor concentration of the semiconductor body. Quantities of lithium ranging from $10^{10}$ atoms per cubic centimeter to $10^{20}$ atoms per cubic centimeter may be dispersed in (Hg,Cd)Te. It is believed that the lithium is present at the lattice sites in the (Hg,Cd)Te, even though the diffusion takes place interstitially. It is believed that lithium is a substitute for metal in the crystal.

It has further been discovered that two adjacent regions of mercury cadmium telluride can be modified so that the second region contains a quantity of lithium dispersed therein in an amount sufficient to measurably increase the acceptor concentration of the second region. If the first region is N-type, and the second region is doped sufficiently to form P-type material, the interface therebetween forms an N-P junction. Moreover, when the first region is P-type, additional lithium to the second region forms a P+-type region adjacent to the first region.

The compositions of the present invention may be manufactured in a wide variety of ways. First, the conventional bulk growth method of making mercury cadmium telluride crystals, which method has been described hereinabove, can be modified by the step of adding a quantity of lithium to the (Hg,Cd)Te prior to formation of the body. In the product, concentrations of the lithium will range, as set forth above, and an acceptor rich body of mercury cadmium telluride will be produced having lithium as a substitution for some of the mercury and/or cadmium in the metal lattice sites of the crystal.

Other well-known methods of preparing mercury cadmium telluride such as vapor phase and liquid phase epitaxy can be modified to permit the inclusion of lithium as an impurity therein to provide an acceptor doped mercury cadmium telluride. Moreover, ion implantation of lithium into already formed mercury cadmium telluride is suitable for increasing the concentration of the product.

A preferred method for adjusting the acceptor concentration in a body of mercury cadmium telluride according to the present invention includes the following steps. A body of mercury cadmium telluride is contacted with a quantity of lithium. Heat is applied to the body for a time sufficient to diffuse the lithium into the body of (Hg,Cd)Te.

One preferred method for causing the diffusion of lithium into a body of mercury cadmium telluride is as follows. A quantity of lithium metal is suspended in a inert medium, such as mineral oil. The medium is placed on a body of mercury cadmium telluride and heated, whereby the powdered metal is deposited on the body by driving off the oil. The deposited metal on the body is then heated at a temperature of at least 290° C, whereby the lithium forms an alloy to a depth of between 0.1 and 0.75 millimeters in one minute. Further heating for a period of time ranging from 0.5 hours to 4 hours at a temperature ranging from 100° to 350° C causes uniform hole concentrations in the order approximately $10^{18}$ or $10^{19}$ per cubic centimeter. Since lithium diffuses so rapidly into the mercury cadmium telluride, limiting the amount of lithium introduced can be accomplished by removing the bulk of the surface deposited lithium prior to the redistribution diffusion. Samples made in this manner have exhibited stable carrier density after storage at room temperature for up to 30 days or more.

It can be readily seen that when the method of the present invention is applied not to an entire body of (Hg,Cd)Te but only to a region of (Hg,Cd)Te, only that region which is doped will be affected by the added lithium impurity. In other words, if one of two adjacent regions is treated with lithium, followed by heat to diffuse the lithium therein, that treated region will be acceptor rich with respect to the second or nontreated region. By this method, compositions are formed which have significantly higher acceptor concentrations in the treated region with respect to the untreated region. If the untreated region is N-type, and the treated region contains sufficient lithium to render it P-type, a PN junction is thereby formed. Similarly, if the first region is P-type, addition of lithium to the second region in the manner described will render it P+-type.

BRIEF DESCRIPTION OF THE DRAWINGS

For a more complete understanding of the invention, reference is hereby made to the drawings, in which.

DETAILED DESCRIPTION OF THE DRAWINGS

Figure 1:
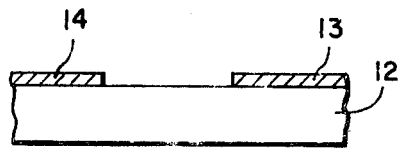
FIGS. 1-6 schematically show a sequential series of steps which modify a body of (Hg,Cd)Te according to a preferred embodiment hereinafter described.
Figure 2:
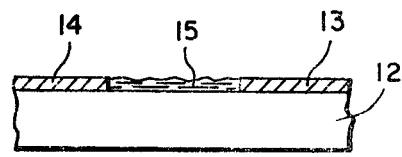
Figure 4:
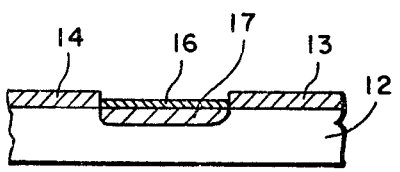
Figure 3:
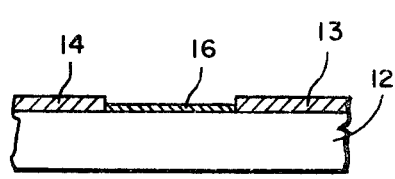
Figure 5:
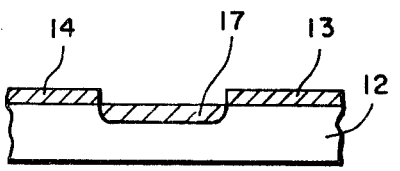
Figure 6:
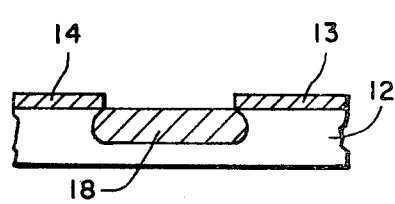

As shown in FIG. 1, a body of mercury cadmium telluride 12 is covered with masks 13 and 14 to define an uncovered region on the body 12 of mercury cadmium telluride. In FIG. 2, a quantity of lithium metal powder suspended in mineral oil 15 is introduced onto the body of (Hg,Cd)Te 12. Sufficient heat is applied to drive off the oil to cause the lithium metal 16 to deposit on the body of mercury cadmium telluride 12 as shown in FIG. 3. By further heating at approximately 290° C, the lithium alloy diffuses into a region 17 of the semiconductor body 12, leaving a surface residue 16, depending on the amount of lithium added and the length of heating. The amount of lithium introduced is limited by removing the undiffused lithium 16 and part of the alloy of FIG. 4, leaving a body of mercury cadmium telluride 12 having a quantity of lithium 17 dispersed therein in FIG. 5. Further heating at approximately 250° C for two hours causes distribution of the lithium to form a region 18 of uniform hole concentrations ranging from $10^{18}$ to $10^{19}$ per cubic centimeter in a body of mercury cadmium telluride 12. Experiments using this method have been performed in which the body 12 of mercury cadmium telluride is N-type. The resulting diffused lithium portion 18 has sufficient acceptor concentration to render that portion P-type. The interface between the body 12 and the doped region 18 forms a P-N junction. Similarly, by starting with P-type material in the body 12, additional acceptor concentration in region 18 forms a P+ region adjacent the P-type region.

Figure 7:
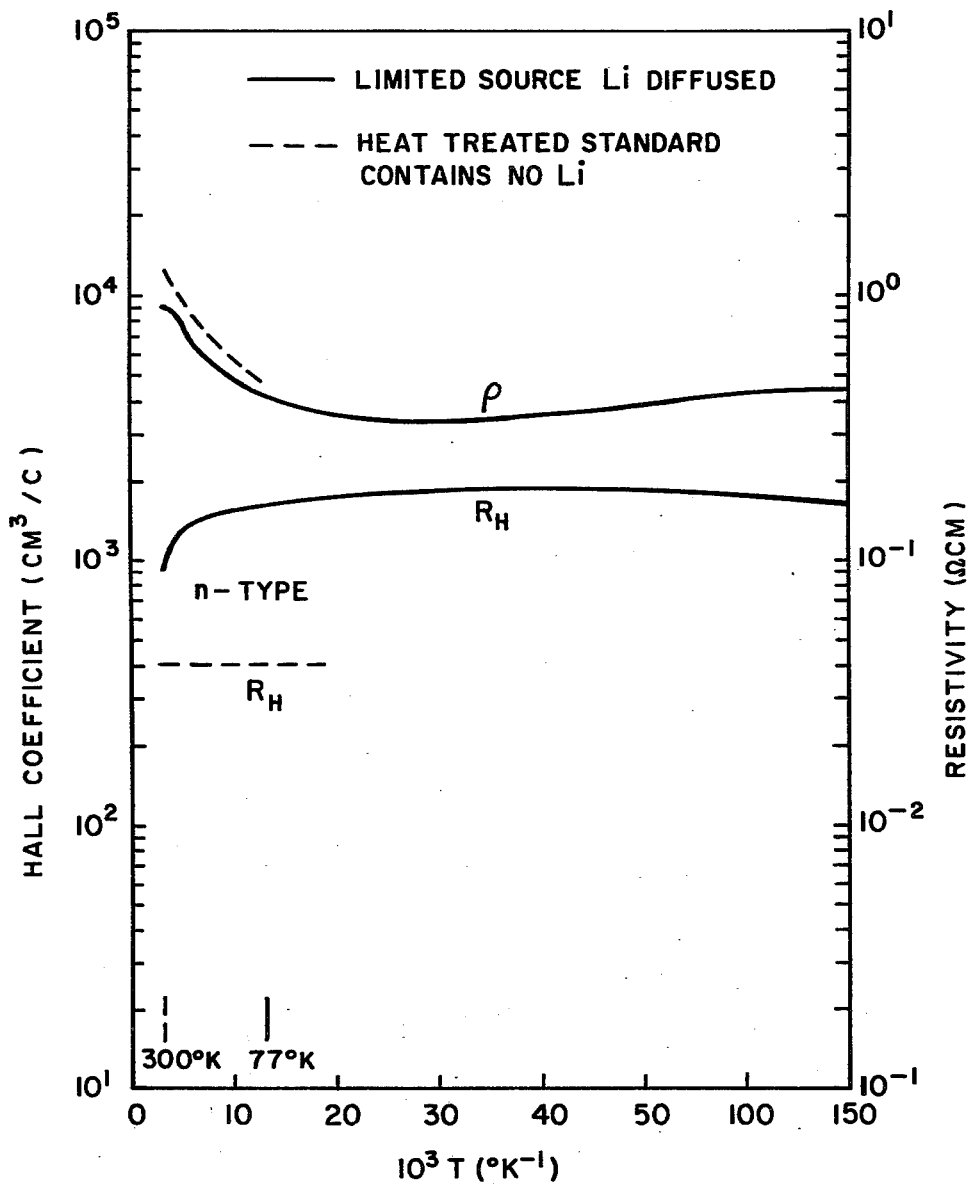
FIG. 7 graphically illustrates the effects of lithium diffused into a body of (Hg,Cd)Te.

FIG. 7 shows the Hall coefficient and resistivity measurements versus inverse temperature for both lithium doped and undoped (Hg,Cd)Te. Specifically, a quantity of N-type (Hg,Cd)Te, where $x = 0.4$, was doped with a quantity of lithium as hereinbefore described to add $1.2 \times 10^{16}$ acceptors/cm$^3$. An identical sample from the same bath of (Hg,Cd)Te was subjected to the same process without the addition of lithium.

While this invention has been disclosed with particular reference to the preferred embodiments, it will be understood by those skilled in the art that changes in the form and details may be made without departing from the spirit and scope of this invention.

The embodiment of the invention in which an exclusive property or right is claimed are defined as follows:

1. Mercury cadmium telluride having a quantity of lithium dispersed therein, in an amount sufficient to measurably increase the acceptor concentration thereof.

2. The composition of claim 1 wherein said quantity of lithium ranges from $10^{10}$ atoms per cubic centimeter to $10^{20}$ atoms per cubic centimeter.

3. The composition of claim 1 wherein said lithium is present at lattice sites in said mercury cadmium telluride.

4. The composition of claim 3 wherein said lithium is substituted for metal in said mercury cadmium telluride.

5. The composition comprising:
   a first region of mercury cadmium telluride; and
   an adjacent second region of mercury cadmium telluride having a quantity of lithium dispersed therein in an amount sufficient to measurably increase the acceptor concentration of said second region.

6. The composition of claim 5 wherein said first region is N-type, said second region is P-type, and the interface therebetween forms an N-P junction.

7. The composition of claim 5 wherein said first region is P-type and second region is P+-type.

8. The composition of claim 5 wherein said quantity of lithium ranges from $10^{10}$ atoms per cubic centimeter to $10^{20}$ atoms per cubic centimetere.

9. The composition of claim 5 wherein said lithium is substituted for metal in said mercury cadmium telluride.

* * * * *